(12) United States Patent
Zavidniak et al.

(10) Patent No.: US 8,297,450 B2
(45) Date of Patent: Oct. 30, 2012

(54) MODULAR RACK FOR MOUNTING AVIONICS EQUIPMENT

(75) Inventors: Martin P. Zavidniak, Carlsbad, CA (US); Dale J. Shabra, San Diego, CA (US); Phillip Y. Chou, San Diego, CA (US); George Gaffoglio, Irvine, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 433 days.

(21) Appl. No.: 12/015,220

(22) Filed: Jan. 16, 2008

(65) Prior Publication Data

US 2009/0178821 A1    Jul. 16, 2009

(51) Int. Cl.
*A47F 7/00* (2006.01)

(52) U.S. Cl. ......... 211/13.1; 211/26; 211/182; 211/194; 361/799; 361/829

(58) Field of Classification Search ............. 211/13.1, 211/194, 182, 26–26.2; 174/50, 51; 361/784, 361/785, 796, 799 X, 829 X; 244/1 R; 312/108, 312/111, 257.1, 223.1, 223.2, 223.6; 403/265
See application file for complete search history.

(56) References Cited

U.S. PATENT DOCUMENTS

| | | | | | |
|---|---|---|---|---|---|
| 3,988,802 | A | * | 11/1976 | Bruni et al. ...................... | 16/429 |
| 4,153,225 | A | * | 5/1979 | Paulsen ....................... | 244/118.1 |
| 5,020,866 | A | * | 6/1991 | McIlwraith ................ | 312/265.4 |
| 5,066,161 | A | * | 11/1991 | Pinney ........................... | 403/172 |
| 5,085,112 | A | * | 2/1992 | MacLennan .................... | 83/840 |
| 5,165,770 | A | * | 11/1992 | Hahn .......................... | 312/265.4 |
| 5,820,289 | A | * | 10/1998 | Kern et al. ..................... | 403/231 |
| 5,997,117 | A | * | 12/1999 | Krietzman .................. | 312/265.4 |
| 6,058,019 | A | * | 5/2000 | Graves et al. ................. | 361/760 |
| 6,484,364 | B2 | * | 11/2002 | Turner ............................ | 16/443 |
| 6,652,048 | B2 | * | 11/2003 | Chen .......................... | 312/223.2 |
| 7,170,747 | B2 | | 1/2007 | Muirhead et al. | |
| 7,362,941 | B2 | * | 4/2008 | Rinderer et al. .............. | 385/134 |
| 2002/0005457 | A1 | * | 1/2002 | Lee et al. ......................... | 244/30 |
| 2004/0201967 | A1 | * | 10/2004 | Muirhead et al. ............. | 361/716 |
| 2006/0082970 | A1 | * | 4/2006 | Walz et al. ..................... | 361/699 |
| 2006/0270470 | A1 | * | 11/2006 | de La Chapelle et al. | . 455/575.5 |
| 2008/0011510 | A1 | * | 1/2008 | Tang et al. .................... | 174/350 |
| 2009/0178983 | A1 | * | 7/2009 | Green et al. ................. | 211/13.1 |

OTHER PUBLICATIONS http://www.engr.utk.edu/mse/Textiles/CARBON%20FIBERS.htm
"Carbon Fibers" see item 10, Table 3 characteristics of carbon fiber by Raghavendra Hegde, Atul Dahiya, M.G. Kamath Apr. 2004.*
Advanced Composites Group Ltd.: "ACG VTM© 243frb and VTM© 244FRB Intermediate Service Temperature Vacuum Processable Prepeg, Preliminary Product Information"; PDS1179/09.06/2, Registered Office Registered No. 2264869 England, pp. 1-5.
Henkel Corporation, Aerospace: "HYSOL® PL 7000 Epoxy Film Adhesive"; www.aerospace.henkel.com, pp. 1-4.

* cited by examiner

*Primary Examiner* — Korie H. Chan
(74) *Attorney, Agent, or Firm* — Tarolli, Sundheim, Covell & Tummino LLP

(57) ABSTRACT

A modular rack for mounting avionics equipment comprises an upper rectangular frame, a lower rectangular frame, and a plurality of struts interconnecting the upper rectangular frame and the lower rectangular frame. Each strut is at least partially formed of an electrically conductive carbon fiber composite material and includes at least one flange extending substantially orthogonal to the strut. The flange includes a plurality of mounting holes to allow avionics equipment to be mounted to the rack. A method of mounting avionics equipment in an aircraft is also provided.

25 Claims, 8 Drawing Sheets

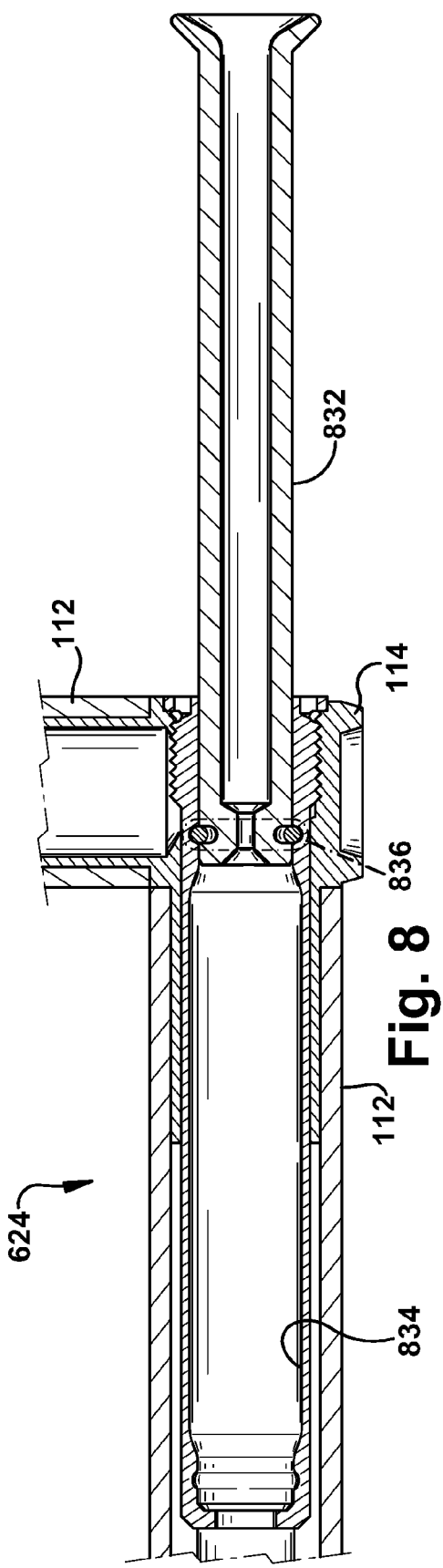
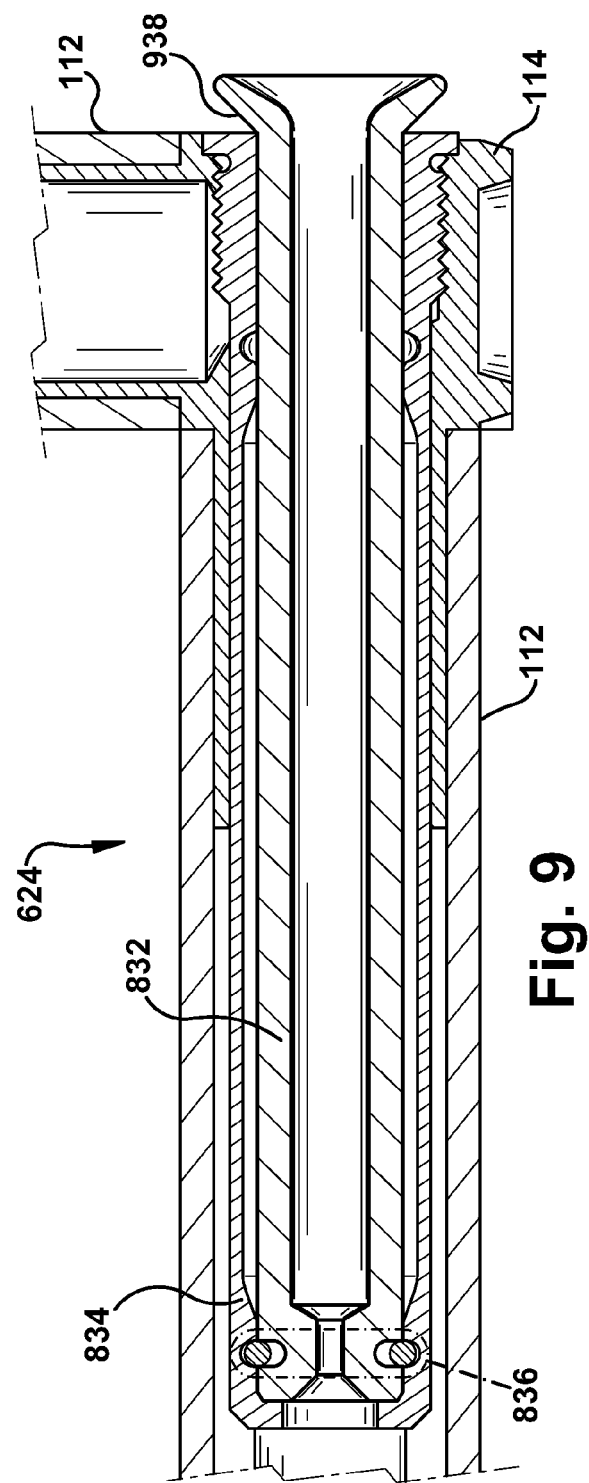
Fig. 8
Fig. 9

MODULAR RACK FOR MOUNTING AVIONICS EQUIPMENT

This invention was made with Government support under Contract No. H94003-04-D-0005-006. The Government has certain rights in this invention.

TECHNICAL FIELD

The present invention relates to an apparatus and method for mounting equipment, and, more specifically, to a modular rack and method for mounting avionics equipment within an aircraft.

BACKGROUND

Airborne electronic equipment or other avionics equipment can be implemented aboard aircraft in a packaging style referred to as Line Replaceable Units ("LRUs"). The term "LRU" refers to a black box of electronics, such as a radio or other auxiliary equipment for a complex engineered system like an airplane or a ship. LRUs speed up installation and repair because they can be installed and replaced quickly. Typically, LRUs also reduce the cost and increase the quality of systems by spreading development costs of the type of unit over different models of vehicles.

LRUs are typically mounted in aircraft equipment racks. Although these equipment racks vary in size and construction, depending upon the aircraft, the racks uniformly provide the means to house the LRUs and secure the LRUs to the aircraft. The weight of the racks (including all LRUs) must be added to the unladen weight of the aircraft to determine the aircraft's total laden weight.

The racks must meet airworthiness standards set forth by the Federal Aviation Administration ("FAA"). The FAA guidelines dictate that the racks must withstand, without plastic deformation, defined ultimate inertia forces, which could occur in a crash, radical aircraft maneuvers, or other situations. The racks must also be heat- and fire-retardant, and corrosion-resistant, to comply with the FAA guidelines.

SUMMARY

The present invention relates to an apparatus and method for mounting equipment. One aspect of the present invention provides a modular rack for mounting avionics equipment. The rack comprises an upper rectangular frame, a lower rectangular frame, and a plurality of struts interconnecting the upper rectangular frame and the lower rectangular frame. Each strut is at least partially formed of an electrically conductive carbon fiber composite material and includes at least one flange extending substantially orthogonal to the strut. The flange includes a plurality of mounting holes to allow avionics equipment to be mounted to the rack.

Another aspect of the present invention provides a modular rack for mounting avionics equipment. An upper rectangular frame includes a plurality of upper frame legs connected by at least one upper node connector. A lower rectangular frame includes a plurality of lower frame legs connected by at least one lower node connector. A plurality of struts are provided. Each strut extends between at least one upper node connector and at least one lower node connector. Each strut is at least partially formed of an electrically conductive carbon fiber composite material and includes at least one flange extending substantially orthogonal to the strut. The flange includes a plurality of mounting holes to allow avionics equipment to be mounted to the rack.

Yet another aspect of the present invention provides a method of mounting avionics equipment in an aircraft. A modular rack is formed from an upper rectangular frame, a lower rectangular frame, and a plurality of struts interconnecting the upper rectangular frame and the lower rectangular frame. Each strut is at least partially formed of an electrically conductive carbon fiber composite material and includes at least one flange extending substantially orthogonal to the strut. At least one item of avionics equipment is mounted to the rack. The rack is attached to a relatively stable surface in the aircraft. At least one electrically conductive grounding path is created from the avionics equipment, through the rack, to the aircraft.

BRIEF DESCRIPTION OF THE DRAWINGS

FIG. 8 is a partial cross-sectional view taken along line 8-8 of FIG. 3, with a component of the mounting rack in a first, extended position.

FIG. 9 is a partial cross-sectional view similar to FIG. 8, with a component of the mounting rack in a second, retracted position.

DETAILED DESCRIPTION

Figure 1:
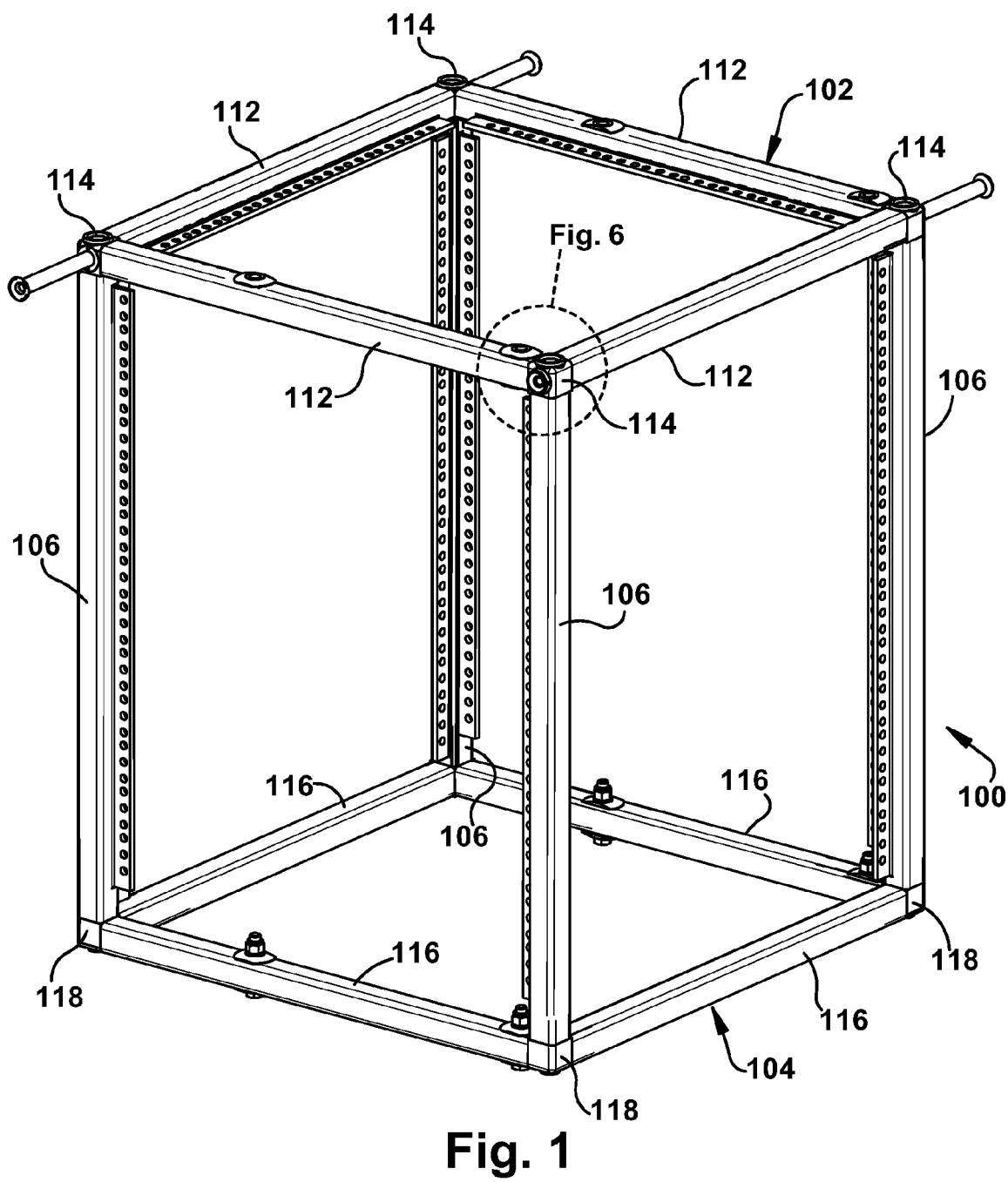
FIG. 1 is a perspective view of a mounting rack in accordance with an aspect of the present invention.
Figure 2:
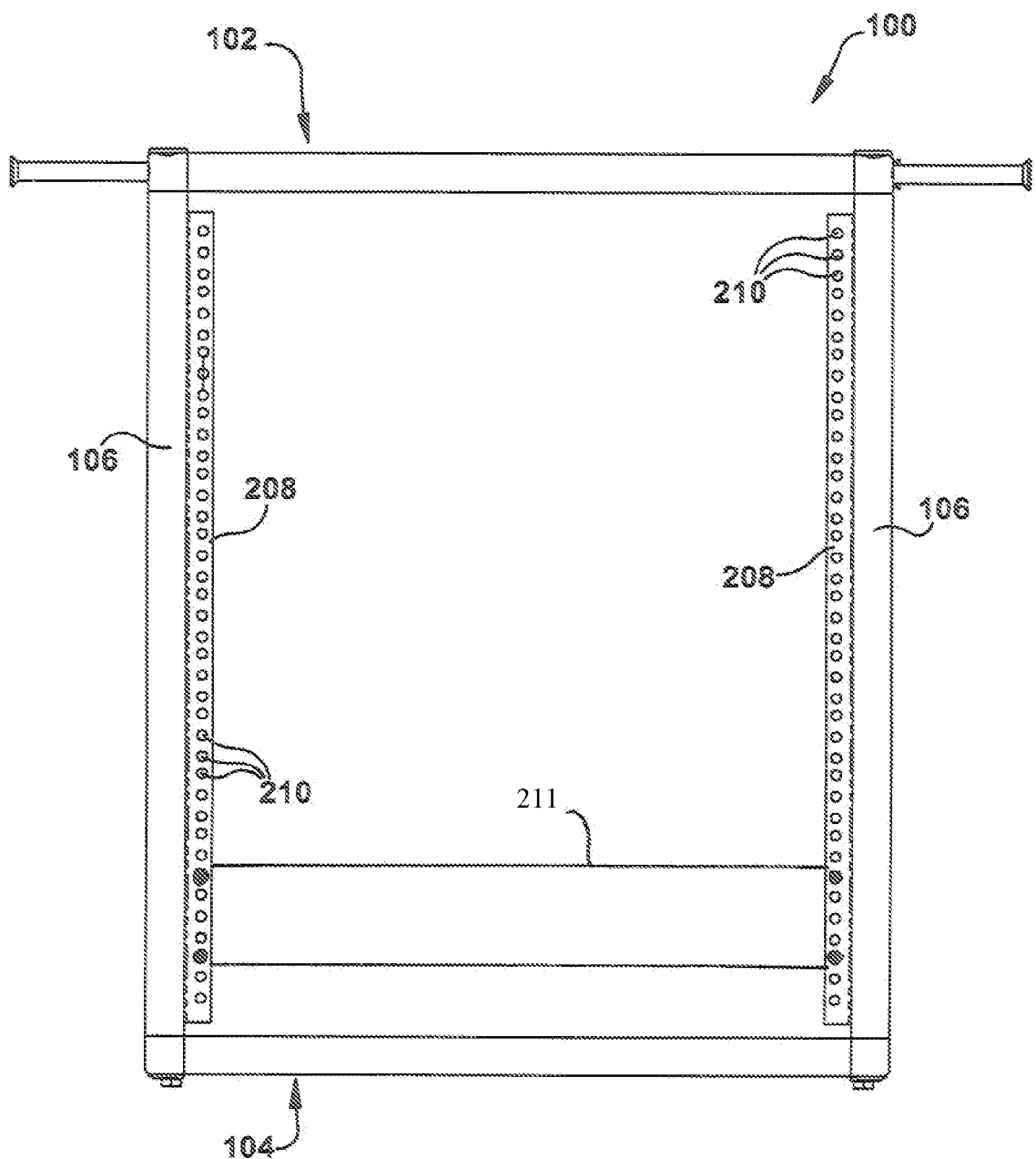
FIG. 2 is a side view of the rack of FIG. 1.
Figure 3:
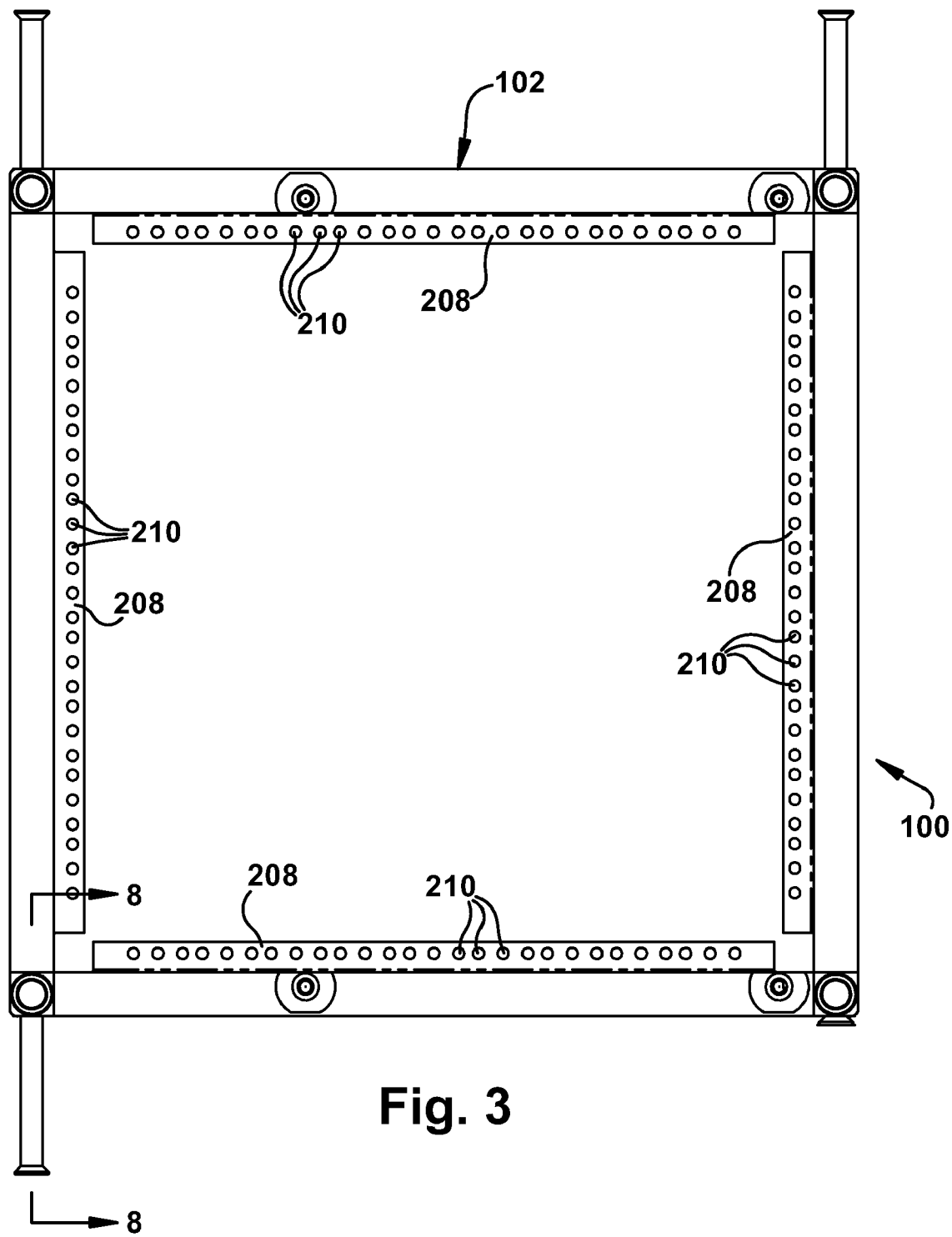
FIG. 3 is a top view of the rack of FIG. 1.

FIGS. 1-3 depict a modular rack 100 in accordance with an aspect of the present invention. The modular rack 100 can be used for mounting electronic and/or avionic equipment, (e.g., such as LRUs) within a vehicle (e.g., aircraft) or environment other in which the equipment is potentially subject to high G loads (e.g., at least about 9G loads) and wide-ranging temperature fluctuations.

With reference to FIG. 1, the rack 100 includes an upper rectangular frame 102, a lower rectangular frame 104, and a plurality of struts 106 that interconnect the upper and lower rectangular frames 102 and 104. Each strut 106 connects corresponding corners of the upper and lower rectangular frames 102 and 104, though one of ordinary skill in the art could readily provide different arrangements of the struts 106 to interconnect the upper and lower rectangular frames 102 and 104. For example, a side bracing strut (not shown) may interconnect noncorner portions of the upper and lower rectangular frames 102 and 104. The struts 106 in FIGS. 1-3 are depicted as having structures similar to each other, merely with differing orientations, but there is no requirement that the struts be matched in shape, size, orientation, configuration, or any other property.

Turning to the side view of FIG. 2, it can be seen that each strut 106 includes at least one flange 208 extending substantially orthogonal to the strut, along at least a portion of the length of the strut. The term "orthogonal" is used to indicate a spatial relationship in which two structures intersect at right angles. The flanges 208 may include a plurality of mounting holes 210 (not all are numbered in the Figures) to allow avionics equipment (an example of which is shown schematically at 211) to be mounted to the rack 100. The mounting holes 210, when present, may have any suitable size, shape, placement, configuration, or other characteristics. For example, the mounting holes 210 shown conform to the well-known Electronic Industries Alliance ("EIA") standards for placement and sizing. Optionally, the mounting holes 210, and/or other components of the rack 100, may be configured to accept avionics equipment 211 of a standard size and spacing, such as that conforming to the known 19-inch (48.26 centimeters) standard for rack sizing.

Figure 4:
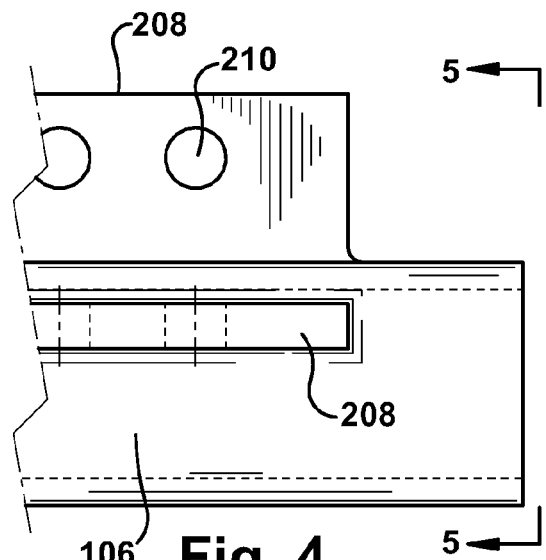
FIG. 4 is a partial side view of a component of FIG. 1.
Figure 5:
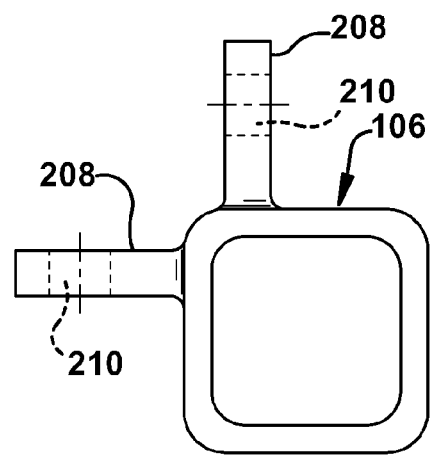
FIG. 5 is a side view taken along line 5-5 of FIG. 4.

FIGS. 4 and 5 depict details of a strut 106 of the rack 100, which may be any strut out of those shown. The strut 106 shown in FIGS. 4 and 5 includes two orthogonally oriented flanges 208, with each of the two flanges in this example view being orthogonally oriented with respect to the other, as well as with respect to the strut. When a plurality of flanges 208 are provided to a single strut 106, the flanges may be oriented in any desired manner with respect to each other. Moreover, though the flanges 208 can be seen in FIG. 5 to be arranged off-center with respect to the strut 106, the flanges 208 may have any placement as desired for a particular application of the present invention.

FIG. 5 also illustrates an example configuration of the strut 106 itself. As is readily apparent from the view shown, the strut 106 may have a substantially rectangular (in this case, square) tubular cross-section. It is contemplated, however, that struts 106 having different sizes, shapes, configurations, cross-sections, or other properties could be used with the present invention. For example, a strut (not shown) could be hollow or solid, or have an L-shaped, triangular, circular, curvilinear, or polygonal cross-section of any desired size.

In an aspect of the invention, at least a portion of at least one strut 106 is formed from a light-weight composite material that is substantially fire retardant (i.e., meets or exceeds FAA fire retardant guidelines) and is capable of withstanding high G loads (e.g., at least about 9G) without deformation. The light-weight composite material can include, for example, electrically conductive carbon fiber composite material.

By way of example, each of the struts 106 can comprise a carbon fiber composite tube that is formed from a resin impregnated woven carbon fiber fabric (not shown). The carbon fiber fabric can include, for example, a woven carbon fiber 4×4 twill, and the resin can include a fire retardant epoxy based resin (e.g., HYSOL epoxy resin, Henkel Corporation, Calif., USA). The composite tube can be formed by wrapping the resin impregnated carbon fiber fabric in alternating weave directions around a mandrel, compressing the wrapped resin impregnated carbon fiber fabric in a mold, and then curing the resin. The resulting composite tube can then be machined to finish the composite tube and form mounting holes in the flange.

Referring to FIG. 3, which is a top plan view of the upper rectangular frame, at least one of the upper and lower rectangular frames 102 and 104 (the lower rectangular frame being obscured in this view) may include at least one flange 208 extending substantially orthogonal to the frame. The flanges 208 associated with the upper and/or lower rectangular frames 102 and 104, like the flanges 208 associated with the struts 106, may include a plurality of mounting holes 210, of any desired type, arrangement, configuration, size, spacing, or other properties, to allow avionics equipment to be mounted to the rack 100.

In the depicted embodiment, although each of the upper and lower rectangular frames 102 and 104 has a square configuration, the upper and lower rectangular frames 102 and 104 may have any rectangular shape. The upper and lower rectangular frames 102 and 104 can have any desired size, relative dimensions, or other characteristic, and need not be matched in any characteristic.

The rack 100 could be formed in one piece or manufactured from separate components. Referring back to FIG. 1, the illustrated rack 100 is formed in the latter manner. The upper rectangular frame 102 includes a plurality of upper frame legs 112 connected by at least one upper node connector 114. Similarly, the lower rectangular frame 104 includes a plurality of lower frame legs 116 connected by at least one lower node connector 118. In the depicted configuration, each strut 106 extends between at least one upper node connector 114 and at least one lower node connector 118.

The upper frame legs 112 and the lower frame legs 116 may have a substantially rectangular (in this case, square) tubular cross-section. It is contemplated, however, that the legs 112 and 116 may have different sizes, shapes, configurations, cross-sections, or other properties. For example, the legs 112 and 116 can be hollow or solid, or have an L-shaped, triangular, circular, curvilinear, or polygonal cross-section of any desired size.

In an aspect of the invention, at least a portion of at least one of the legs 112 and 116 are formed from a light-weight composite material that is substantially fire retardant (i.e., meets or exceeds FAA fire retardant guidelines) and is capable of withstanding high G loads (e.g., at least about 9G) without deformation. The light-weight composite material can include, for example, electrically conductive carbon fiber composite material. The electrically conductive carbon fiber composite material can be similar to the electrically conductive carbon fiber composite described above with respect to the struts 106. By way of example, each of the legs 112 and 116 can comprise a carbon fiber composite tube that is formed from a resin impregnated woven carbon fiber fabric (not shown).

Figure 6:
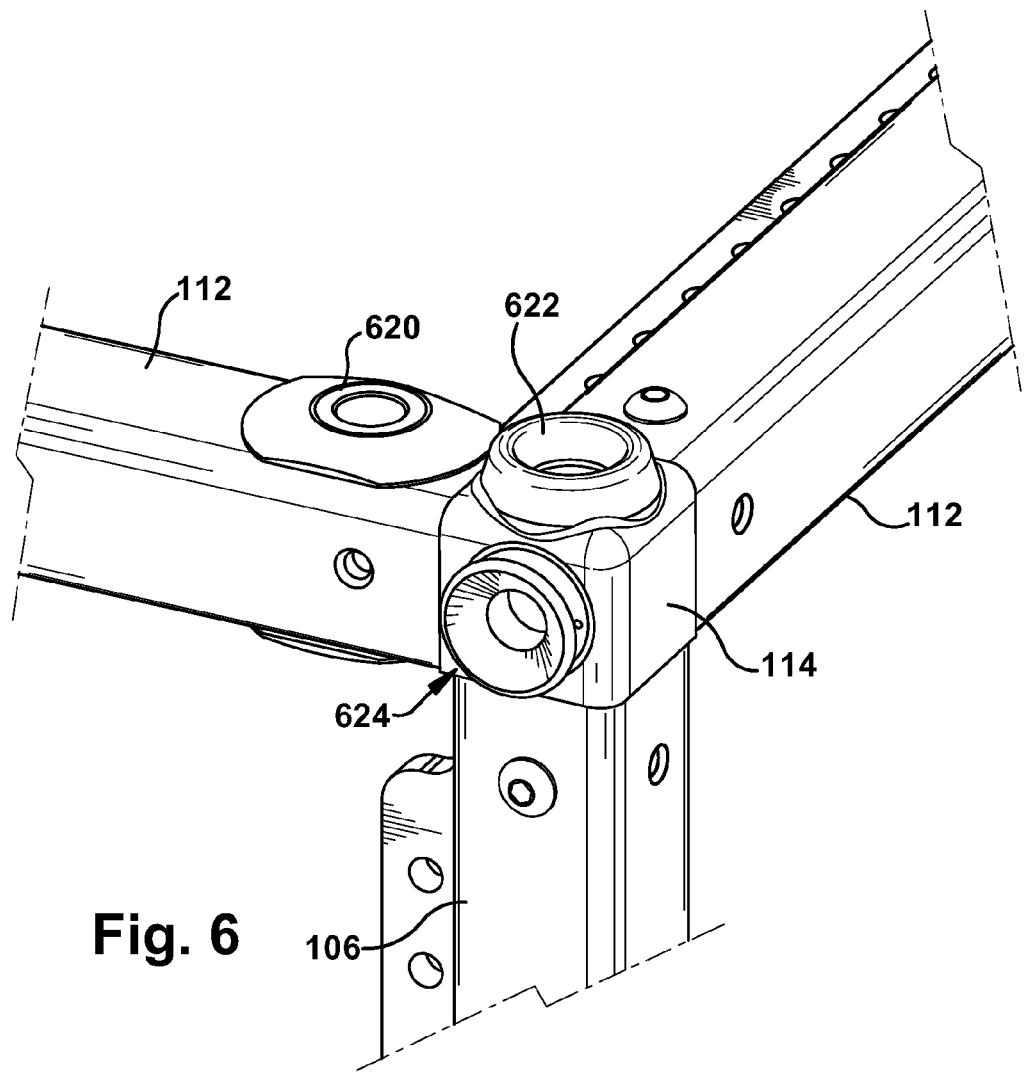
FIG. 6 is a partial perspective view taken within circle 6 of FIG. 1.
Figure 7:
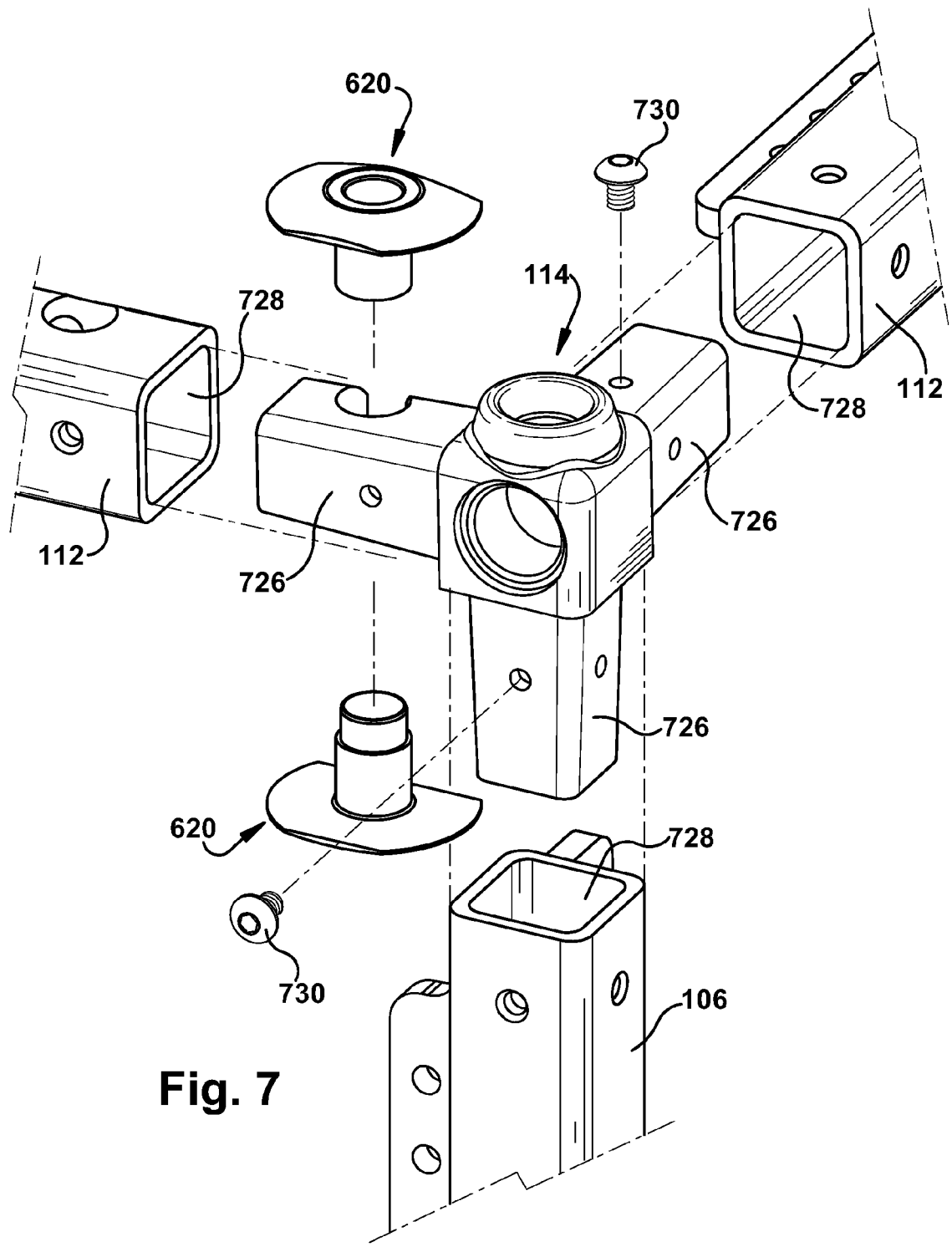
FIG. 7 is an exploded perspective view similar to FIG. 6.

FIG. 6, which is indicated by circle 6 in FIG. 1, depicts a detail of the arrangement of the upper frame legs 112 and an upper node connector 114 at one corner of the rack 100, with FIG. 7 being an exploded view similar to FIG. 6. One of the upper frame legs 112 includes an upper mount fitting 620 that can be used for receiving a fastener (not shown) for interconnecting a plurality of modular racks 100, as will be discussed shortly. The upper node connector 114 can include a foot socket 622 for interconnecting multiple racks and a lifting handle 624 for moving the rack 100. The upper node connectors 114, as well as the lower node connectors 118, are formed from a high-strength lightweight material, such as aluminum. It will be appreciated that other materials can be used to form the upper and lower node connectors 114 and 118.

Referring to FIG. 7, the upper node connector 114 has a one-piece tripod-type configuration that includes three insert legs 726. Each of the insert legs 726 is mated with a correspondingly positioned inner cavity 728 of a strut 106 and two upper frame legs 112. Though each insert leg 726 of the upper node connector 114 depicted in FIG. 7 mates with one of the three inner cavities 728 of the components forming the corner of the rack 100, the number of insert legs 726 and inner cavities 728 need not be identical. The insert legs 726 may be held to the strut 106 and upper frame legs 112 in any manner including, for example, frictional engagement, adhesives or other chemical fasteners, bolts or other mechanical fasteners, and/or combinations thereof. In the embodiment shown in FIG. 7, the upper node connector 114 is at least partially held in an interconnected position with the strut 106 and upper frame legs 112 by (a) one or more assembly screws 730 inserted into corresponding holes in each of the upper node connector, strut, and one upper frame leg, (b) two pieces of the upper mount fitting 620 inserted through corresponding holes in the upper node connector and the other upper frame leg, and (c) an adhesive (not shown) that is applied to mating surfaces of the insert leg 726 and the strut 106 and upper frame legs 112. In the depicted embodiment, the remaining upper node connectors 114 of the rack 100 are constructed similarly to that shown in FIGS. 6 and 7, as are all of the lower node connectors 118. It will be appreciated that one of ordinary skill in the art can readily design a rack 100 in which one or more of the upper and lower node connectors 114 and 118 are constructed, formed, attached, or otherwise configured differently from one or more of the other upper and lower node connectors.

FIGS. 8 and 9 illustrate an example embodiment of the retractable lifting handle 624 for use with the rack 100. The lifting handle 624 is retractable into the inner cavity 728 of at least one of the upper frame legs 112. It will be appreciated, however, that one of ordinary skill in the art can readily provide at least one retractable or fixed, permanent or temporary, lifting handle of any desired configuration at any desired location on the rack 100. The lifting handle 624 shown in FIGS. 8 and 9 is shown, and will be described, as being mounted through the upper node connector 114 and into an upper frame leg 112.

Referring to FIG. 8, which depicts the lifting handle 624 in a first, extended or deployed position, the lifting handle 624 includes a movable handle 832 extending from a stationary sleeve 834. The stationary sleeve 834 can be fastened within the upper frame leg 112 in any manner, such as frictional engagement, adhesives or other chemical fasteners, threads or other mechanical interlocking features, fasteners, or the like. The movable handle 832 is configured to slide into and out of the stationary sleeve 834. The lifting handle can also include a detent means (generally indicated by oblong dot-dash line 836) to prevent the handle from disengaging from the stationary sleeve 834 and/or from sliding in relation to the stationary sleeve without some positive action by the operator.

FIG. 9 depicts the lifting handle 624 in a second, retracted or stowed position. In this position, the movable handle 832 is at least partially stored within the stationary sleeve 834. The detent means 836 in the position of FIG. 9 can prevent the handle from extending out of the stationary sleeve 834 without a positive action by the operator. The moveable handle can include a handle flange 938 that prevents the movable handle 832 from retracting entirely into the stationary sleeve 834 and/or provides a readily grasped structure to assist the operator in sliding the movable handle 832 between the extended and retracted positions.

Each lifting handle 624 may be formed of a relatively resilient material, such as stainless steel. It will be appreciated that other material can also be used to form the handles. The movable handle 832 may have a gripping surface (not shown) with a surface treatment, covering, padding, or other feature to assist the operator in gripping the movable handle securely and/or comfortably. The rack 100 shown in the Figures includes four lifting handles 624, with one on each corner of the upper rectangular frame 102. (One of the lifting handles 624 is shown in the Figures as being in the second, retracted position with the other three lifting handles depicted in the first, extended position.) Nonetheless, one of ordinary skill in the art can readily provide a suitable number of suitably configured and placed lifting handles 624 for a particular application of the present invention, based upon one or more factors such as, but not limited to, available lifting personnel, rack size or other physical configuration factors, loaded rack weight, rated rack weight, or the like.

Figure 10:
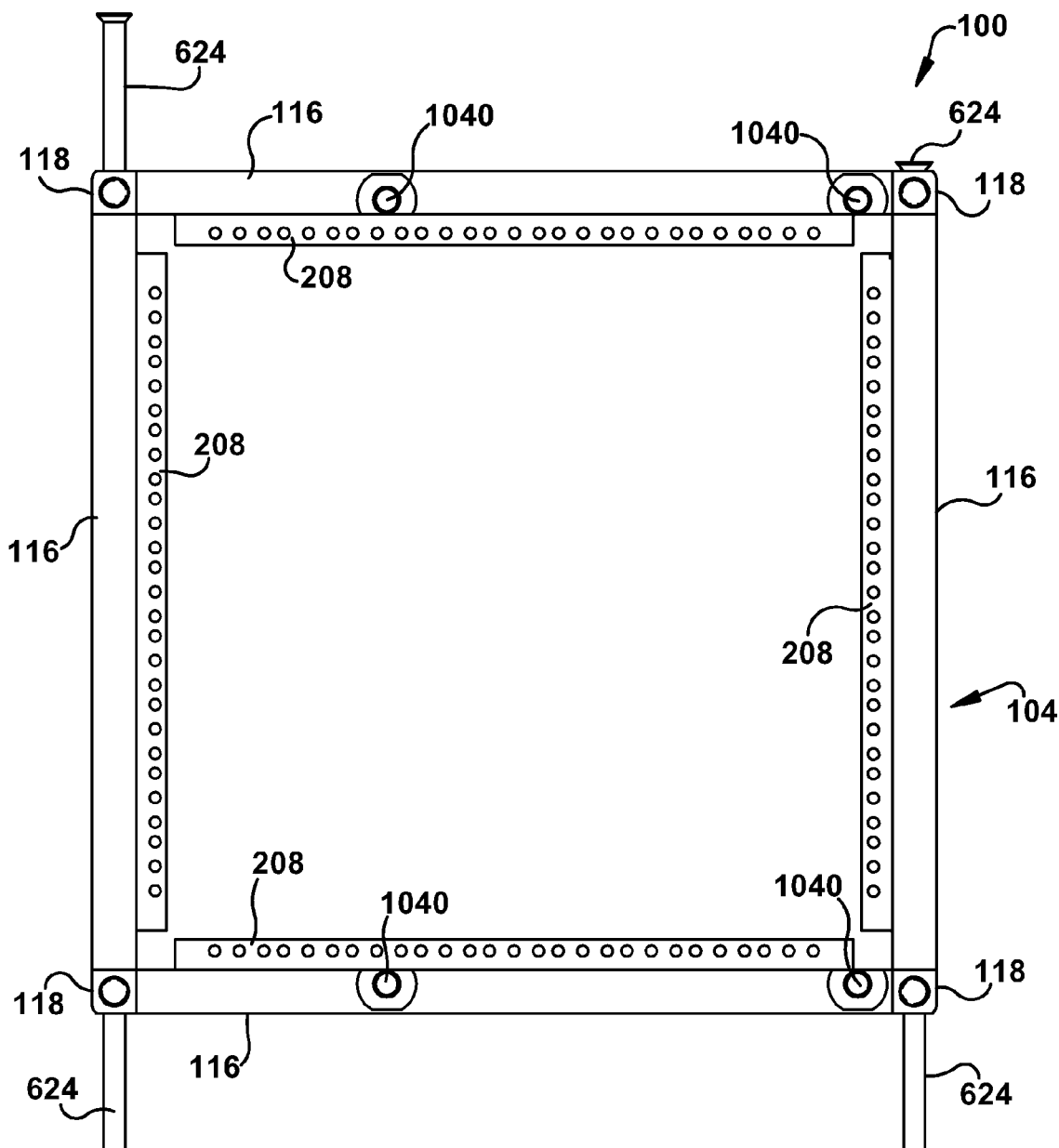
FIG. 10 is a bottom view of the rack of FIG. 1.

FIG. 10 depicts a bottom view of the rack 100 showing the lower rectangular frame 104 including the lower frame legs 116 and lower node connectors 118, as well as a plurality of lower mount fittings 1040. As can be seen in FIG. 1, the lower frame legs 116 of the depicted embodiment do not include flanges 208; the flanges seen in FIG. 10 are the flanges of the upper frame legs 112, viewed from below. The lower frame legs 116 could, however, include flanges 208, as desired for a particular application of the present invention.

With reference again to FIG. 10, the lower rectangular frame includes four lower mount fittings 1040 that are mounted off-center, both longitudinally and laterally, on the lower rectangular frame 104. It will be appreciated though that any number of lower mount fittings 1040 may be present and positioned as desired.

Figure 11:
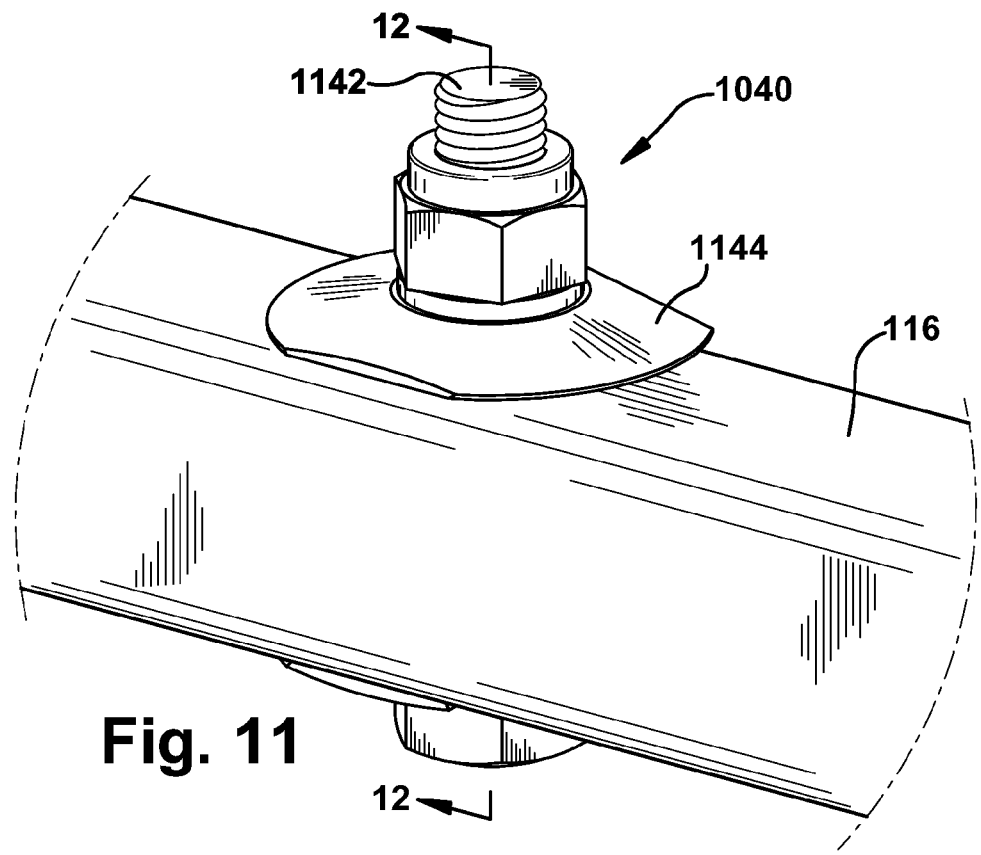
FIG. 11 is a partial perspective view of a component of the rack of FIG. 10.
Figure 12:
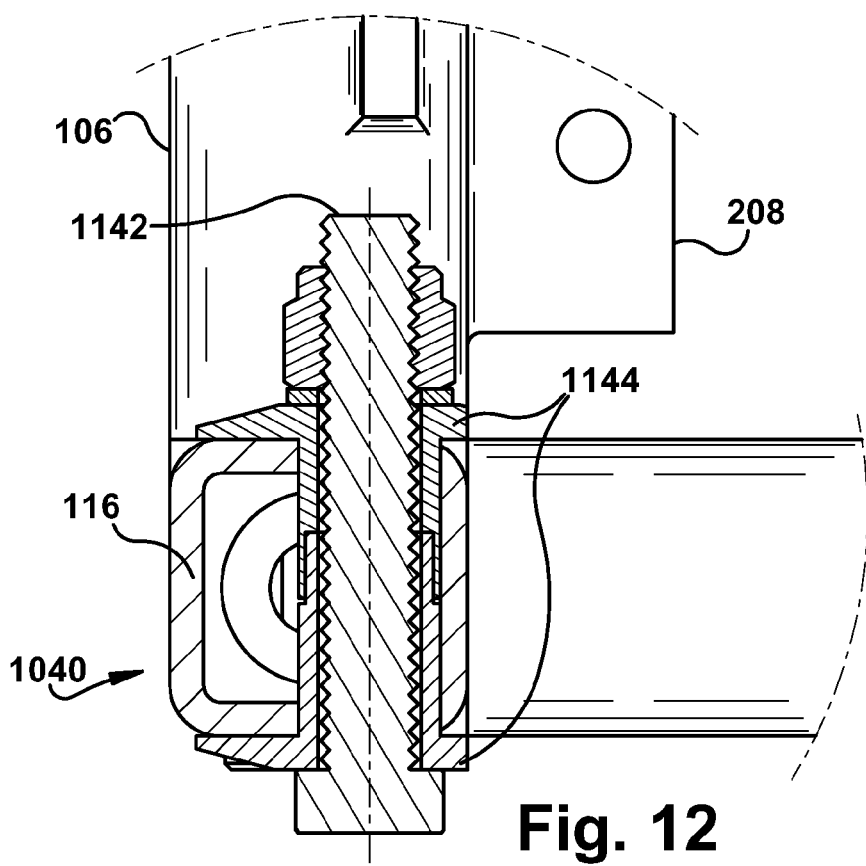
FIG. 12 is a partial cross-sectional view taken along line 12-12 of FIG. 11.

FIG. 11 illustrates a closer view of the lower mount fitting 1040. The lower mount fitting 1040 includes a mounting stud 1142 and a two-piece bushing 1144. As is depicted in the cross-sectional view of FIG. 12, the mounting stud 1142 extends through the lower frame leg 116 and connects the two-piece bushing 1144 to the lower frame leg 116. The engagement of the mounting stud 1142 and two-piece bushing 1144 may assist in distributing force from the mounting stud 1142 to the lower frame leg 116. The lower mount fitting 1040 may be configured to engage with a base structure (not shown) to secure the rack 100. For example, the lower mount fitting 1040, in either the depicted configuration or another configuration, may be used to fasten the rack 100 to a floor-mounted L-channel bracket of an aircraft in a known manner. Similarly, the lower mount fitting 1040 may be used to fasten the rack 100 to a dolly or cart to assist in temporary manual transport of the rack 100 to and/or from an aircraft or other at least semi-permanent location. The term "manual transport" is used herein to indicate that the rack 100 is physically moved to a location by one or more persons, with minimal or no assistance from an automatic device or other non-human-powered means.

The lower mount fitting 1040, or another component of a first rack 100 may be configured to engage an upper mount fitting 620 or another component of a second rack (not shown) and thereby secure the first rack atop the second rack. In other words, the lower rectangular frame 104 may be configured for attachment to at least one of a base structure and another modular rack, and the upper rectangular frame 102 may be configured for attachment to another modular rack.

The lower rectangular frame 104 may include one or more support feet (not shown) configured to space the lower rectangular frame a short distance away from the underlying surface. This spacing may be useful in allowing airflow beneath the rack 100, cushioning the rack, allowing insertion of items beneath the rack, or for any other reason. When support feet are provided, it is contemplated that the number, size, configuration, and other properties of the support feet are chosen to support the rack 100 in a stable manner. One or more support feet may be adjustable to compensate at least partially for an uneven base structure beneath the rack 100. One or more support feet may also or instead include a uni- or multi-directional caster, a fixed wheel, or another low-friction feature to assist in moving the rack 100 laterally, without lifting. The support feet may be formed in one piece with one or more rack 100 components, or may be separately provided. For example, each lower node connector 118 may be molded with a protruding support foot on a lower surface (not shown) of the connector. When one rack 100 is stacked atop another rack (not shown), the support feet of the top rack may be configured to mate, match, or engage with the foot sockets 622 of the bottom rack to assist in relatively positioning and/or interlocking the top and bottom racks.

The rack 100 can also include at least one electrically conductive grounding path (not shown) for grounding avionics equipment mounted to the rack. This grounding path may be provided by an additional structure (not shown) attached to the rack 100 or to one or more components of the rack, or may be provided through the previously described structure of the rack itself. For example, and particularly when at least one of the struts 106, upper frame legs 112, and lower frame legs 116 are at least partially formed of an electrically conductive material, at least one of the upper and lower node connectors 114 and 118 may include an electrically conductive feature or structure (not shown), such as a conductive lining, a grounding strap, or any other suitable feature. In such case, if the upper and/or lower node connectors 114 and 118 are attached to at least one of the struts 106, upper frame legs 112, and lower frame legs 116 by at least one assembly screw 730, the grounding path optionally travels through the assembly screw, or another connector, fastener, or other component of the rack 100. In other words, the grounding path need not travel through structures of the rack 100 dedicated for the purpose, but could be provided entirely by material and configuration choices of the structural components of the rack 100.

In operation, one example method of mounting avionics equipment to the aircraft comprises several steps, which may be performed in any desired order. A modular mounting rack, such as the rack 100 described above and pictured in the Figures, is provided. At least one item of avionics equipment (not shown) is mounted to the rack. For example, one or more fasteners could be passed through mounting brackets (not shown) on the avionics equipment and secured to one or more mounting holes 210 on one or more flanges 208 of the rack 100.

The rack 100 is manually moved into the aircraft, such as by one or more persons grasping the lifting handles 624 and hoisting the rack 100 into a desired position by manipulation (lifting, pulling, and the like) of the lifting handles. The rack 100 is then attached to a relatively stable surface in the aircraft, such as a bulkhead or floor. For example, the lower mount fittings 1040, when provided, of a rack 100 could engage L-channel brackets of the aircraft floor.

When the lifting handles 624 are of the retractable type, the movable handles 832 may be stowed in the retracted position to allow for closer lateral placement of a plurality of racks. Another, second rack could be placed atop the first rack and secured to the first rack in any desirable manner, such as, but not limited to, by mating of the foot sockets 622 of the first rack with support feet of the second rack, and/or by engagement of one or more upper mount fittings 620 of the first rack with correspondingly placed lower mount fittings 1040 of the second rack.

When the avionics equipment includes electrical or electronic features needing to be connected with structures external to the rack, such connections may be made as desired. At any suitable time during the above procedure, at least one electrically conductive grounding path may be created from the avionics equipment to the aircraft, optionally passing through at least a portion of the rack 100.

As previously mentioned, it may be desirable for the rack 100, or specific components thereof, to meet certain standards of performance, whether set by a government entity such as the FAA, by a customer/client/private association, by a designer of the rack, or by any other entity. For example, the rack 100 may be configured to withstand a force of at least 9G applied in any orientation, without permanent deformation. One of ordinary skill in the art could readily provide a rack 100 with components having suitable materials, sizes, shapes, configurations, arrangements, surface treatments, and other properties as desired to meet this or any other standard.

What has been described above includes exemplary implementations of the present invention. It is not possible to describe every conceivable combination of components or methodologies for purposes of describing the present invention, but one of ordinary skill in the art will recognize that many further combinations and permutations of the present invention are possible. For example, the flanges 208 need not be orthogonal to their corresponding struts 106. The components of the rack 100 may be made of any desired material or combination of materials, and using any desired manufacturing methods. The stainless steel referenced above may be 304 stainless steel. The aluminum mentioned above may be an A356-T6 aluminum alloy. The modular racks 100 could be stacked two or more high, in storage and/or usage, and could be secured to each other and/or an adjacent structure. Accordingly, the present invention is intended to embrace all such alterations, modifications and variations that fall within the spirit and scope of the appended claims.

What is claimed is:

1. A modular rack for mounting avionics equipment, comprising:
    an upper rectangular frame;
    a lower rectangular frame; and
    a plurality of struts interconnecting the upper rectangular frame and the lower rectangular frame, each strut being at least partially formed of an electrically conductive carbon fiber composite material and each strut including at least one flange extending substantially orthogonal to that strut, the flange including a plurality of mounting holes to allow avionics equipment to be directly mounted to the rack; wherein at each corners of the at least one of the upper and lower rectangular frames includes an inner cavity enclosed within a tubular cross-section thereof, and the modular rack includes one retractable lifting handle at each of said corners, each of the lifting handles being separately and substantially retracted into the inner cavity of a respective one of the corners of the at least one of the upper and lower rectangular frames when the lifting handle is in a stowed position, and each of the lifting handles extending laterally from at least one of the upper and lower rectangular frames when the lifting handle is in a deployed position.

2. The modular rack of claim 1, wherein at least one of the upper and lower rectangular frames is at least partially formed of an electrically conductive carbon fiber composite material.

3. The modular rack of claim 1, wherein at least one of the upper and lower rectangular frames includes at least one flange extending substantially orthogonal to the frame, and the flange includes a plurality of mounting holes to allow avionics equipment to be mounted to the rack.

4. The modular rack of claim 1, including at least one electrically conductive grounding path for grounding avionics equipment mounted to the rack, the grounding path extending from the avionics equipment, through the rack and via at least one lower mount fitting of the lower rectangular frame, to an aircraft.

5. The modular rack of claim 1, wherein the lower rectangular frame is configured for attachment to at least one of a base structure and another modular rack.

6. The modular rack of claim 1, wherein the upper rectangular frame is configured for attachment to another modular rack.

7. The modular rack of claim 1, wherein at least one strut includes two orthogonally oriented flanges.

8. The modular rack of claim 1, wherein at least one of the upper and lower rectangular frames includes a plurality of frame legs connected by at least one node connector.

9. The modular rack of claim 8, wherein at least one node connector includes an electrically conductive feature.

10. The modular rack of claim 1, being configured to withstand a force of at least 9G applied in any orientation, without permanent deformation.

11. A modular rack for mounting avionics equipment, comprising:
- an upper rectangular frame including a plurality of upper frame legs connected by at least one upper node connector;
- a lower rectangular frame including a plurality of lower frame legs connected by at least one lower node connector, the lower rectangular frame including at least one lower mount fitting, the lower mount fitting being configured for selective engagement with a relatively stable surface of an aircraft; and
- a plurality of struts, each strut extending between at least one upper node connector and at least one lower node connector, each strut being at least partially formed of an electrically conductive carbon fiber composite material and each strut including at least one flange extending substantially orthogonal to that strut, the flange including a plurality of mounting holes to allow avionics equipment to be directly mounted to the rack; wherein at each corners of the at least one of the upper and lower rectangular frames includes an inner cavity enclosed within a tubular cross-section thereof, and the modular rack includes one retractable lifting handle at each of said corners, each of the lifting handles being separately and substantially retracted into the inner cavity of a respective one of the corners of the at least one of the upper and lower rectangular frames when the lifting handle is in a stowed position, and each of the lifting handles extending laterally from at least one of the upper and lower rectangular frames when the lifting handle is in a deployed position.

12. The modular rack of claim 11, wherein at least one of the upper and lower frame legs is at least partially formed of an electrically conductive carbon fiber composite material.

13. The modular rack of claim 11, wherein at least one upper and lower node connector includes an electrically conductive feature.

14. The modular rack of claim 11, wherein at least one of the upper and lower frame legs includes at least one flange extending substantially orthogonal to the frame leg, and the flange includes a plurality of mounting holes to allow avionics equipment to be mounted to the rack.

15. The modular rack of claim 11, including at least one electrically conductive grounding path for grounding avionics equipment mounted to the rack, the grounding path extending from the avionics equipment, through the rack and via at least one lower mount fitting, to the aircraft.

16. The modular rack of claim 11, wherein at least one lower node connector is configured for attachment to at least one of a base structure and an upper node connector of another modular rack.

17. The modular rack of claim 11, wherein at least one upper node connector is configured for attachment to a lower node connector of another modular rack.

18. The modular rack of claim 11, being configured to withstand a force of at least 9G applied in any orientation, without permanent deformation.

19. A method of mounting avionics equipment in an aircraft, the method comprising the steps of:
- forming a modular rack from an upper rectangular frame, a lower rectangular frame, and a plurality of struts interconnecting the upper rectangular frame and the lower rectangular frame, each strut being at least partially formed of an electrically conductive carbon fiber composite material and each strut including at least one flange extending substantially orthogonal to that strut, the lower rectangular frame including at least one lower mount fitting, the lower mount fitting being configured for selective engagement with the aircraft;
- directly mounting at least one item of avionics equipment to the rack;
- attaching the rack to a relatively stable surface in the aircraft; and
- creating at least one electrically conductive grounding path from the avionics equipment, through the rack and via at least one lower mount fitting, to the aircraft providing at each corners of the at least one of the upper and lower rectangular frames with an inner cavity enclosed within a tubular cross-section thereof and providing one retractable handle at each of said corners configured for lifting the rack, each of the lifting handles being separately and substantially retracted into the inner cavity of a respective one of the corners of the at least one of the upper and lower rectangular frames when the lifting handle is in a stowed position, and each of the lifting handles extending laterally from at least one of the upper and lower rectangular frames when the lifting handle is in a deployed position; and manually moving the rack into the aircraft through manipulation of at least one of the handles.

20. The method of claim 19, wherein the step of mounting at least one item of avionics equipment to the rack includes the step of fastening the item of avionics equipment to the rack via at least one of a plurality of mounting holes in the flange.

21. The method of claim 19, wherein the rack is a first modular rack having an upper mount fitting on an upper rectangular frame thereof, and including the step of attaching a second modular rack to the first modular rack by connecting the upper rectangular frame of the first modular rack to a lower rectangular frame of the second modular rack through engagement of at least one lower mount fitting of the second modular rack with the upper mount fitting of the first modular rack.

22. A modular rack for mounting avionics equipment, comprising:
- an upper rectangular frame;
- a lower rectangular frame including at least one lower mount fitting;
- at least one lower mount fitting includes a mounting stud and a two-piece bushing, each piece of the bushing being tubular in cross-section and extending longitudinally through at least a portion of the tubular cross-section of the lower rectangular frame, each piece of the bushing extending collinearly with the other piece of the bushing to form a tubular bore extending entirely longitudinally through the tubular cross-section of the lower rectangular frame, the mounting stud extending longitudinally through the tubular cross-section of the lower rectangular frame and being at least partially located within the tubular bore of the two-piece bushing, the two-piece bushing completely spacing the mounting stud from contact with the lower rectangular frame;

at each corners of one of the upper and lower rectangular frames includes an inner cavity enclosed within a tubular cross-section thereof;

a plurality of retractable lifting handles, each of the lifting handles being separately and substantially retracted into the inner cavity of a respective one of the corners of the at least one of the upper and lower rectangular frames when the lifting handle is in a stowed position, and the each of the lifting handles extending laterally from at least one of the upper and lower rectangular frames when the lifting handle is in a deployed position;

a plurality of struts interconnecting the upper rectangular frame and the lower rectangular frame, each strut being at least partially formed of an electrically conductive carbon fiber composite material and each strut including at least one flange extending substantially orthogonal to that strut, the flange including a plurality of mounting holes to allow avionics equipment to be mounted to the rack; and at least one electrically conductive grounding path for grounding avionics equipment mounted to the rack, the grounding path extending from the avionics equipment, through the rack and via at least one lower mount fitting of the lower rectangular frame, to an aircraft.

23. The modular rack of claim 22, wherein at least one of the upper and lower rectangular frames is at least partially formed of an electrically conductive carbon fiber composite material.

24. The method of claim 19, wherein the at least one lower mount fitting includes a mounting stud and a two-piece bushing, each piece of the bushing being tubular in cross-section and extending longitudinally through at least a portion of the tubular cross-section of the lower rectangular frame, each piece of the bushing extending collinearly with the other piece of the bushing to form a tubular bore extending entirely longitudinally through the tubular cross-section of the lower rectangular frame, the mounting stud extending longitudinally through the tubular cross-section of the lower rectangular frame and being at least partially located within the tubular bore of the two-piece bushing, the two-piece bushing completely spacing the mounting stud from contact with the lower rectangular frame.

25. The modular rack of claim 1, wherein at least one lower mount fitting includes a mounting stud and a two-piece bushing, each piece of the bushing being tubular in cross-section and extending longitudinally through at least a portion of the tubular cross-section of the lower rectangular frame, each piece of the bushing extending collinearly with the other piece of the bushing to form a tubular bore extending entirely longitudinally through the tubular cross-section of the lower rectangular frame, the mounting stud extending longitudinally through the tubular cross-section of the lower rectangular frame and being at least partially located within the tubular bore of the two-piece bushing, the two-piece bushing completely spacing the mounting stud from contact with the lower rectangular frame.

* * * * *